United States Patent
Ikenaga

(10) Patent No.: US 10,557,201 B2
(45) Date of Patent: Feb. 11, 2020

(54) VAPOR-PHASE GROWTH APPARATUS

(71) Applicant: TAIYO NIPPON SANSO CORPORATION, Tokyo (JP)

(72) Inventor: Kazutada Ikenaga, Saitama (JP)

(73) Assignee: TAIYO NIPPON SANSO CORPORATION, Tokyo (JP)

( * ) Notice: Subject to any disclaimer, the term of this patent is extended or adjusted under 35 U.S.C. 154(b) by 194 days.

(21) Appl. No.: 15/402,566

(22) Filed: Jan. 10, 2017

(65) Prior Publication Data

US 2017/0198392 A1    Jul. 13, 2017

(30) Foreign Application Priority Data

Jan. 12, 2016   (JP) ................................. 2016-003203

(51) Int. Cl.
   *C23C 16/40* (2006.01)
   *C23C 16/458* (2006.01)
   *C23C 16/455* (2006.01)

(52) U.S. Cl.
   CPC ........ *C23C 16/4584* (2013.01); *C23C 16/455* (2013.01)

(58) Field of Classification Search
   CPC . C23C 16/4584; C23C 16/4401; C23C 16/46; C23C 16/455
   USPC ..................................... 156/345.55; 118/730
   See application file for complete search history.

(56) References Cited

U.S. PATENT DOCUMENTS

| | | | | |
|---|---|---|---|---|
| 9,156,743 | B2* | 10/2015 | Minoura | ............... C04B 37/005 |
| 2002/0017363 | A1* | 2/2002 | Nakashima | ......... C23C 16/4584 156/345.12 |
| 2003/0049372 | A1* | 3/2003 | Cook | ..................... C23C 16/24 427/248.1 |
| 2010/0021631 | A1* | 1/2010 | Moriyama | .......... C23C 16/4412 427/255.23 |
| 2013/0167771 | A1 | 7/2013 | Yamaguchi et al. | |

FOREIGN PATENT DOCUMENTS

| | | |
|---|---|---|
| JP | 2005-243766 | 9/2005 |
| JP | 2008-021708 | 1/2008 |
| JP | 2017-95777 | 6/2017 |

* cited by examiner

*Primary Examiner* — Rudy Zervigon
(74) *Attorney, Agent, or Firm* — Nixon & Vanderhye P.C.

(57) ABSTRACT

The present invention provides a gas-phase growth apparatus in which an upper part of a circular susceptor 13 on the upper surface of which a substrate 17 is arranged is provided into a circular opening 12a formed at a bottom wall of the flow channel 12, while rotating the susceptor, the substrate is heated by a heater 14 provided under the susceptor through the susceptor, a reaction gas is supplied into the flow channel, and a thin film is produced on the substrate, wherein a rotation driving device 18 for rotating the susceptor is arranged in a state of surrounding the heater, and includes a cylindrical rotation member 19 for supporting the circumferential edge of the susceptor by the top end.

3 Claims, 1 Drawing Sheet

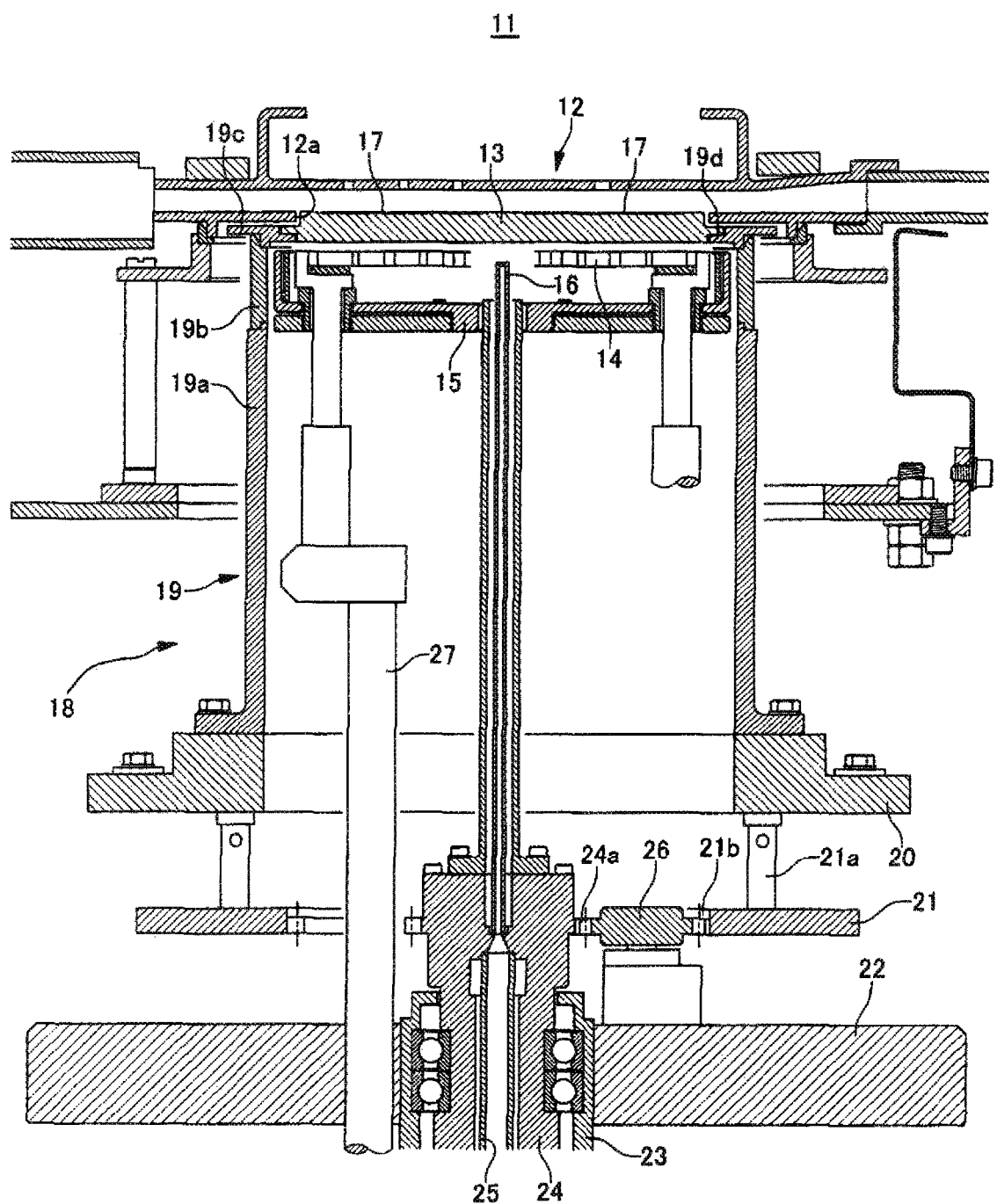

VAPOR-PHASE GROWTH APPARATUS

This application claims priority to JP Patent Application No. 2016-003203 filed 12 Jan. 2016, the entire contents of which is hereby incorporated by reference.

TECHNICAL FIELD

The present invention relates to a vapor-phase growth apparatus, specifically, a vapor-phase growth apparatus including a rotational mechanism for rotating a susceptor, on which a substrate is arranged, under the bottom part of a flow channel.

BACKGROUND ART

As a vapor-phase growth apparatus for producing a thin film such as a compound semiconductor used in a light emission device such as a light emitting diode, and a laser diode, an apparatus, in which a substrate is arranged on an upper surface of a susceptor which is rotatably provided in a circular opening formed at a bottom wall of a flow channel, while rotating a rotational axis supporting the center bottom of the susceptor, the substrate is heated to a fixed temperature through the susceptor by a heating means provided under the susceptor, and a specific reaction gas is supplied into the flow channel so as to flow parallel to the surface of the substrate, and thereby a specific thin film is produced on the substrate, has been widely used (Patent Document 1).

In such a vapor-phase growth apparatus, it is well known that by providing a flange, which is parallel to a bottom surface of the flow channel, on an circumference of the susceptor, the damage of the heater or the like which is caused by outflowing a part of a reaction gas or the like flowing in the flow channel through a gap between the circumference of the susceptor and an inner wall of a circular opening, is inhibited and the decrease of the temperature around the susceptor is also inhibited (Patent Document 2).

PRIOR ART DOCUMENT

Patent Document

[Patent Document 1] Japanese Unexamined Patent Application, First Publication No. 2008-21708
[Patent Document 2] Japanese Unexamined Patent Application, First Publication No. 2005-243766

SUMMARY OF INVENTION

Technical Problem

As disclosed in Patent Document 2, by providing the flange on the circumference of the susceptor, it is possible to inhibit the outflow of the reaction gas from the flow channel. However, there is a possibility that the reaction gas which is flown out little by little from the flow channel is accumulated on the heater or the like, the heating efficiency is decreased, or uneven heating is generated. Due to this, it is necessary to regularly clean the heater. In addition, heat may be radiated from a gap between a bottom surface of the susceptor and an upper surface of the heater, the radiant heat heats the flow channel around the susceptor, a reaction gas may react around the susceptor, and a reaction product may be adhered on an inner surface of the flow channel. In particular, the reaction product adhered on the susceptor at the upstream side causes particles, and degrades the reproducibility of a thin film. Therefore, there is a problem that the cleaning cycle of members forming the vapor-phase growth apparatus including the flow channel is reduced.

An object of the invention is to provide a gas-phase growth apparatus which can effectively heat the susceptor while inhibiting the damage of the heater by the reaction gas flowing out from the flow channel as well as inhibiting the heating of the flow channel around the susceptor.

Solution to Problem

In order to achieve the object, the present invention provides a gas-phase growth apparatus in which an upper part of a circular susceptor on the upper surface of which a substrate is arranged is provided into a circular opening formed at a bottom wall of the flow channel, while rotating the susceptor, the substrate is heated by a heater provided under the susceptor through the susceptor, a reaction gas is supplied into the flow channel, and a thin film is produced on the substrate, wherein a rotation driving device for rotating the susceptor is arranged in a state of surrounding the heater, and includes a cylindrical rotation member for supporting the circumferential edge of the susceptor by the top end thereof.

In addition, the present invention also provides the gas-phase growth apparatus, wherein the cylindrical rotation member includes a cylindrical main body, a susceptor supporting member having a short cylindrical shape provided at the top end of the cylindrical main body, and a plate ring-shaped support base provided at the top end of the susceptor supporting member, and a mounting part for carrying the circumferential edge of the susceptor is provided at the inner wall of the ring-shaped support base.

In addition, the present invention provides the gas-phase growth apparatus, wherein the cylindrical main body is made of quartz, the susceptor supporting member and the ring-shaped support base are made of boron nitride or silicon boron nitride.

Advantageous Effects of Invention

According to the gas-phase growth apparatus of the present invention, since the circumferential edge of the susceptor is supported by the cylindrical rotation member surrounding the heater, if a part of the reaction gas or the like flowing in the flow channel is flown out from the gap between the circumference of the susceptor and an inner wall of a circular opening, the reaction gas or the like flows at the outer circumference of the cylindrical rotation member, and thereby, it is possible to inhibit the flow of the reaction gas or the like around the heater, which is arranged in of the cylindrical rotation member.

In addition, it is also possible to inhibit the heating of the flow channel due to the radiant heat of the heater by the cylindrical rotation member.

Therefore, since the amount of the adhesion of the reaction product to the heater and the flow channel can be remarkably reduced, it is possible to reduce time and effort for removing the adhesion, remarkably improve the efficiency of thin film formation of the gas-phase growth apparatus, and the reproducibility.

BRIEF DESCRIPTION OF DRAWINGS

FIG. 1 is a front cross-sectional view showing an embodiment of the gas-phase growth apparatus according to the present invention.

DESCRIPTION OF EMBODIMENTS

FIG. 1 shows one embodiment of the gas-phase growth apparatus according to the present invention. The gas-phase growth apparatus 11 of this embodiment includes a flow channel 12 stored in a chamber which is not shown in FIG. 1, a susceptor 13 having a circular shape in plan view of which an upper portion is arranged into a circular opening 12a formed at a bottom wall of the flow channel 12, a heater 14 arranged under the susceptor 13, a reflector 15 arranged so as to surround the lower and side part of the heater 14, a temperature sensor 16 having a temperature measuring part arranged below the center part of the susceptor 13, and a rotation driving device 18 for supporting and rotating the susceptor 13 on which the substrate 17 is arranged.

The rotation driving device 18 has an inner diameter which is larger than a maximum outer diameter of the heater 14 and the reflector 15. The rotation driving device 18 includes a cylindrical rotation member 19 arranged so as to surround the heater 14 and the reflector 15. The cylindrical rotation member 19 includes a cylindrical main body 19a, a susceptor supporting member 19b having a flat ring-shape provided at the top end of the cylindrical main body 19a, and a plate ring-shaped support base 19c provided at the top end of the susceptor supporting member 19b. The plate ring-shaped support base 19c includes a mounting part 19d for carrying the circumferential edge of the susceptor 13.

The cylindrical main body 19a is preferably made of a material having heat resistance and lower heat conductivity, for example, quartz. The susceptor supporting member 19b and the plate ring-shaped support base 19c are preferably made of a material having high heat reflectivity and high heat insulation function, for example, boron nitride or silicon boron nitride. When these members are made of such a material, the susceptor 13 can be effectively heated without release of heat from the heater 14.

Under the cylindrical rotation member 19, a first ring-shaped rotation member 20 for supporting the lower part of the cylindrical main body 19a and a second ring-shaped rotation member 21 for supporting the first ring-shaped rotation member 20 via a supporting bar 21a. At an inner circumference of the second ring-shaped rotation member 21, an inner gear 21b is formed.

At a center of a base plate 22 provided under a chamber, a supporting cylinder 23 is penetrated in a vertical direction. In the supporting cylinder 23, a cylindrical rotation axis 24 is provided so as to penetrate the supporting cylinder 23 via a bearing. In addition, inside of the cylindrical rotation axis 24, a sensor supporting member 25 for supporting the temperature sensor 16 is provided. At an upper outer circumference of the cylindrical rotation axis 24 connected to a monitor which is not shown in FIG. 1, a driving gear 24a is provided. Between the driving gear 24a and the inner gear 21b of the second ring-shaped rotation member 21, an intermediate gear 26 for transmitting the rotation of the driving gear 24a to the second ring-shaped rotation member 21 through the inner gear 21b is rotatably supported by a base plate 22.

In addition, in the base plate 22 where is inside of the cylindrical rotation member 19 and the outside the cylindrical rotation axis 24, an electric power supplying member 27 for supporting the heater 14 and the reflector 15 and supplying electric power is provided. The electric power supplying member 27 and the intermediate gear 26 are respectively provided at places that they do not interfere with each other.

When a thin film is produced on the substrate 17 using the gas-phase growth apparatus explained above, first, in a state that a certain number of the substrate 17 is arranged on the susceptor 13, the cylindrical rotation axis 24 is rotated at a fixed rotational speed by a motor, and rotates the susceptor 13 through the driving gear 24a, the intermediate gear 26, the inner gear 21b, the second ring-shaped rotation member 21, the supporting bar 21a, the first ring-shaped rotation member 20, and the cylindrical main body 19a, the susceptor supporting member 19b, and the plate ring-shaped support base 19c of the cylindrical rotation member 19. In addition, by operating the heater 14, in a state that the substrate 17 is heated to a predetermined temperature by the susceptor 13, a predetermined reaction gas is introduced into the flow channel 12, the reaction gas is reacted on the upper surface of the substrate 17, and a thin film is produced on the substrate 17.

During the film-forming operation, if a part of the reaction gas or the like flowing in the flow channel 12 flows out from the gap between the inner wall of the circular opening 12a and the circumference of the susceptor 13 by the change of conditions, such as the pressure or the flow rate of the reaction gas or the like flowing inside the flow channel 12, or the pressure or the flow rate of a purge gas flowing outside of the flow channel 12 in the chamber, since the upper side of the heater 14 and the reflector 15 is covered with susceptor 13 and the plate ring-shaped support base 19c, and the circumference of the heater 14 and the reflector 15 is covered with the susceptor supporting member 19b and the cylindrical main body 19a, the reaction gas does not flow around the heater 14 and the reflector 15, and the reaction gas or the reaction product does not adhere to the heater 14 or the reflector 15. Thereby, the susceptor 13 can be uniformly heated with high efficiency, and a homogeneous thin film can be produced.

In addition, since the heater 14 and the reflector 15 is covered and sealed with the cylindrical rotation member 19, in particular, by forming the susceptor supporting member 19b and the plate ring-shaped support base 19c by a material having high heat reflectivity and heat insulation function, it is possible to inhibit heating of the flow channel 12 around the susceptor 13 by the radiation heat generated by the heater 14. In particular, since it is possible to inhibit the increase of the temperature at the bottom wall of the flow channel 12 where is the upstream side of the susceptor 13, it is remarkably decrease the adhesion of the reaction product in the flow channel 12 at the upstream side of the susceptor 13 by the reaction of the reaction gas at the upstream side of the susceptor 13. Thereby, it is possible to inhibit the generation of the particles, and improve the quality of the thin film formed, and reproducibility.

In addition, since the adhesion of the reaction product to the flow channel 12 or the heater 14 can be inhibited, the cleaning work for removing the reaction product can be reduced, and thereby productivity can also be improved. Furthermore, since the heating the flow channel 12 around the susceptor 13 can be inhibited, the reaction of the reaction gas around the susceptor 13 can be inhibited, the reaction gas can be effectively used to produce the thin film growth, and the use efficiency of the raw material can also be improved.

INDUSTRIAL APPLICABILITY

Since the adhesion of the reaction product to the heater or the flow channel can be remarkably reduced, the cleaning work for removing the reaction product can be reduced, and

| | DESCRIPTION OF THE REFERENCE SIGNS | | |
|---|---|---|---|
| 11 | gas-phase growth apparatus | 12 | flow channel |
| 12a | circular opening | 13 | susceptor |
| 14 | heater | 15 | reflector |
| 16 | temperature sensor | 17 | substrate |
| 18 | rotation driving device | 19 | cylindrical rotation member |
| 19a | cylindrical main body | 19b | susceptor supporting member |
| 19c | plate ring-shaped support base | 19d | mounting part |
| 20 | first ring-shaped rotation member | 21 | second ring-shaped rotation member |
| 21a | supporting bar | 21b | inner gear |
| 22 | base plate | 23 | supporting cylinder |
| 24 | cylindrical rotation axis | 24a | driving gear |
| 25 | sensor supporting member | 26 | intermediate gear |
| 27 | electric power supplying member | | |

The invention claimed is:

1. A gas-phase growth apparatus in which an upper part of a circular susceptor on the upper surface of which a substrate is arranged is provided into a circular opening formed at a bottom wall of a flow channel, while rotating the susceptor, the substrate is heated by a heater provided under the susceptor through the susceptor, a reaction gas is supplied into the flow channel, and a thin film is produced on the substrate, wherein a rotation driving device for rotating the susceptor including a cylindrical rotation member, and the cylindrical rotation member which is configured to support the circumferential edge of the susceptor by the top end thereof is arranged in a state of surrounding the heater the heater is covered and sealed with the cylindrical rotation member, the cylindrical rotation member includes a cylindrical main body, a susceptor supporting member having a short cylindrical shape provided at the top end of the cylindrical main body, and a plate ring-shaped support base provided at the top end of the susceptor supporting member, and a mounting part for carrying the circumferential edge of the susceptor is provided at the inner wall of the ring-shaped support base, and the susceptor supporting member and the ring-shaped support base are made of boron nitride or silicon boron nitride.

2. The gas-phase growth apparatus according to claim 1, wherein the cylindrical main body is made of quartz.

3. The gas-phase growth apparatus according to claim 1, wherein the reaction gas is introduced in a direction parallel to the substrate surface through the flow channel, such that the flow channel is configured to supply the reaction gas in the direction parallel to the substrate surface from the flow channel to the substrate that is arranged in the circular opening formed at the bottom wall of the flow channel.

* * * * *